United States Patent [19]
Rhodes et al.

[11] Patent Number: 5,262,343
[45] Date of Patent: Nov. 16, 1993

[54] DRAM STACKED CAPACITOR FABRICATION PROCESS

[75] Inventors: Howard E. Rhodes; Pierre Fazan; Hiang C. Chan; Charles H. Dennison; Yauh-Ching Liu, all of Boise, Id.

[73] Assignee: Micron Technology, Inc., Boise, Id.

[21] Appl. No.: 852,822

[22] Filed: Mar. 6, 1992

Related U.S. Application Data

[63] Continuation of Ser. No. 684,420, Apr. 12, 1991, abandoned.

[51] Int. Cl.$^5$ .............................. H01L 21/70
[52] U.S. Cl. ........................ 437/52; 437/47; 437/48; 437/60; 437/200; 437/233; 437/919
[58] Field of Search ............... 437/47, 48, 52, 60, 437/191, 192, 193, 195, 200, 225, 228, 233; 359/236; 365/149, 145

[56] References Cited

U.S. PATENT DOCUMENTS

| | | | |
|---|---|---|---|
| 4,495,219 | 1/1985 | Kato et al. | 437/919 |
| 4,951,175 | 8/1990 | Kurosawa | 437/48 |
| 4,970,564 | 11/1990 | Kimura et al. | 357/23.6 |

OTHER PUBLICATIONS

"A Ferroelectric Dram Cell for High-Density NVRAMS'S" by R. Moazzami et al., 1990 IEEE Electron Device Letters, Oct. 1990.

L. Manchamda, "Yitrium oxide/silicon dioxide: A new dielectric structure for VLSI/ULSI structure" IEEE Electron Dev. Letters vol. 9, Apr. 11, 1988, p. 180.

Primary Examiner—Tom Thomas
Attorney, Agent, or Firm—David J. Paul

[57] ABSTRACT

This invention relates to semiconductor circuit memory storage devices and more particularly to a process to develop three-dimensional stacked capacitor cells using a high dielectric constant material as a storage cell dielectric and a combination of conductively doped polysilicon and metal silicide as the capacitor plates of a storage cell for use in high-density dynamic random access memory (DRAM) arrays. The present invention teaches how to fabricate three-dimensional stacked capacitors by modifying an existing stacked capacitor fabrication process to construct the three-dimensional stacked capacitor cell incorporating a high dielectric constant material as the cell dielectric that will allow denser storage cell fabrication with minimal increases of overall memory array dimensions. A capacitance gain of 3 to 10× or more over that of a conventional 3-dimensional storage cell is gained by using a high dielectric constant material as the storage cell dielectric.

19 Claims, 16 Drawing Sheets

DRAM STACKED CAPACITOR FABRICATION PROCESS

This application is a continuation of application Ser. No. 684,420 filed Apr. 12, 1991 now abandoned.

FIELD OF THE INVENTION

This invention relates to semiconductor circuit memory storage devices and more particularly to a process to develop three-dimensional stacked cell capacitors incorporating a material having a high dielectric constant for use as a storage cell dielectric with self-aligned top and bottom metal storage capacitor electrodes for use in high-density dynamic random access memory (DRAM) arrays.

BACKGROUND OF THE INVENTION

In dynamic semiconductor memory storage devices it is essential that the storage node capacitor retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node capacitance in densely packed memory devices is through the use of "stacked storage cell" design. With this technology, two layers of conductive material, such as polycrystalline silicon (polysilicon or poly) are deposited over an access device on a silicon wafer with a dielectric layer sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by Reza Moazzami et al., entitled "A Ferroelectric DRAM Cell for High-Density NVRAM's," IEEE ELECTRONIC DEVICE LETTERS, VOL. 11, NO. 10, OCTOBER 1990, pp. 454–456, herein incorporated by reference, discusses the use of a PZT ferroelectric material as a cell dielectric in a planar capacitor.

As discussed on pp. 455 in section B. DRAM Mode, a PZT ferroelectric material has been used as the storage cell's dielectric film. As stated and shown in FIG. 3a, pp. 455, very little degradation was observed in the small-signal capacitance after $10^{10}$ read/write cycles.

The PZT ferroelectric material has a high dielectric constant very favorable for use as a storage cell dielectric, but as discussed in this article PZT has only been used experimentally in planar storage capacitors. It is also a much electrically leakier film than nitride films that are in current use and must be deposited much thicker to reduce this undesirable current leakage. The selection of electrode materials now becomes critical when using a PZT cell dielectric. Reza et al. reports the use of platinum metal electrodes which are incompatible with silicon device manufacturing.

Using a high dielectric constant material as the cell dielectric presents a cell leakage problem that must be taken into consideration that is different from a conventional storage capacitor. As illustrated in FIG. 1a, a conventional storage cell using a thin dielectric, such as nitride, is depicted. $I_1$ represents leakage current between a capacitor's top and bottom cell plates (or top cell plate and storage node cell plate). $I_2$ represents leakage current between adjacent storage node cell plates. A worst case scenario for cell to cell leakage would be 0 volts on storage node 1 and Vcc volts on adjacent storage node 2 with Vcc/2 on common top plate 3. A typical planar cell dielectric is 0.01 microns thick while the storage node to storage node spacing is 1.0 microns. The conventional storage cell present leakage current $I_1$ as the dominant leakage that one must be concerned with as $I_1 >> I_2$ as the capacitor's top and bottom cell plates are closer to one another than are adjacent storage node cell plates.

Referring now to FIG. 1b, a cell (later to be developed in the present invention) using a high dielectric constant material for its cell dielectric must contain a much thicker layer of dielectric than one having a nitride cell dielectric, but due to its high dielectric breakdown characteristics at this increased thickness, leakage current $I_1$ becomes very small. At the same time however, if the surface area of the storage node cell plate is to be maximized, the spacing of adjacent storage node cell plates becomes less than the spacing between the two cell plates of the capacitor. However, even if the storage node to storage node distance remains fixed at 1.0 microns, there is $2\times$ greater potential difference between adjacent storage nodes as compared to storage node to top plate. So in the case of the present invention represented in FIG. 1b, $I_2 >> I_1$ and a process must be developed (which is described in the following text) to eliminate this cell to cell leakage, $I_2$ while maintaining high cell capacitance and close cell to cell spacing.

The present invention addresses both leakage current issues by fabricating a storage cell using a high dielectric constant material combined with a conventional dielectric in a preferred embodiment or alternatively, a storage cell using only a high dielectric constant material in a second embodiment. Both embodiments modify an existing stacked capacitor fabrication process to construct a three-dimensional stacked capacitor cell that will allow denser storage cell fabrication with minimal increases of overall memory array dimensions.

SUMMARY OF THE INVENTION

The invention is directed to maximizing storage cell surface area while minimizing both a capacitor's plate to plate leakage current as well as adjacent storage node cell to cell leakage current in a high density/high volume DRAM (dynamic random access memory) fabrication process. An existing stacked capacitor fabrication process is modified to construct a three-dimensional stacked capacitor utilizing a material, possessing a high dielectric constant, as the cell dielectric and a combination of conductively doped polysilicon and metal silicide as the storage capacitor plates. Three key elements of the present invention include: 1) a polysilicon etchback of the storage node to maximize cell capacitance, 2) the use of silicides for both cell electrodes (polysilicon is currently used with a nitride cell dielectric and a platinum metal is used with a high dielectric constant cell dielectric), and 3) $I_2$ elimination by use of a dielectric fill process. The present invention defines a capacitor storage cell only for a DRAM process, however it will be evident to one skilled in the art to incorporate these steps into other processes requiring memory cells such as VRAMs, EPROMs or the like.

After a silicon wafer is prepared using conventional process steps, the present invention creates a conductive storage node structure conforming to the wafer's topology formed by two adjacent digit lines running perpendicular to and over the top of three adjacent word lines. A high dielectric constant material is used as the storage cell dielectric allowing for increased capacitance and minimal leakage current while maintaining the surface area required for a conventional 3-dimensional storage cell.

DETAILED DESCRIPTION OF THE PREFERRED EMBODIMENT

A preferred embodiment of the present invention is directed to maximizing storage cell capacitance in a high density/high volume DRAM fabrication process, in a sequence shown in FIGS. 2-11.

A silicon wafer is prepared using conventional process steps up to the point of defining a cell array. Capacitor fabrication will now follow.

The capacitor of each cell will make contact with a buried contact within the cell. Each active area within the array is isolated from one another by a thick field oxide and can be arranged in interdigitated columns and non-interdigitated rows. The active areas are used to form active MOS transistors that can be doped as NMOS or PMOS type FETs depending on the desired use.

Figure 1A:
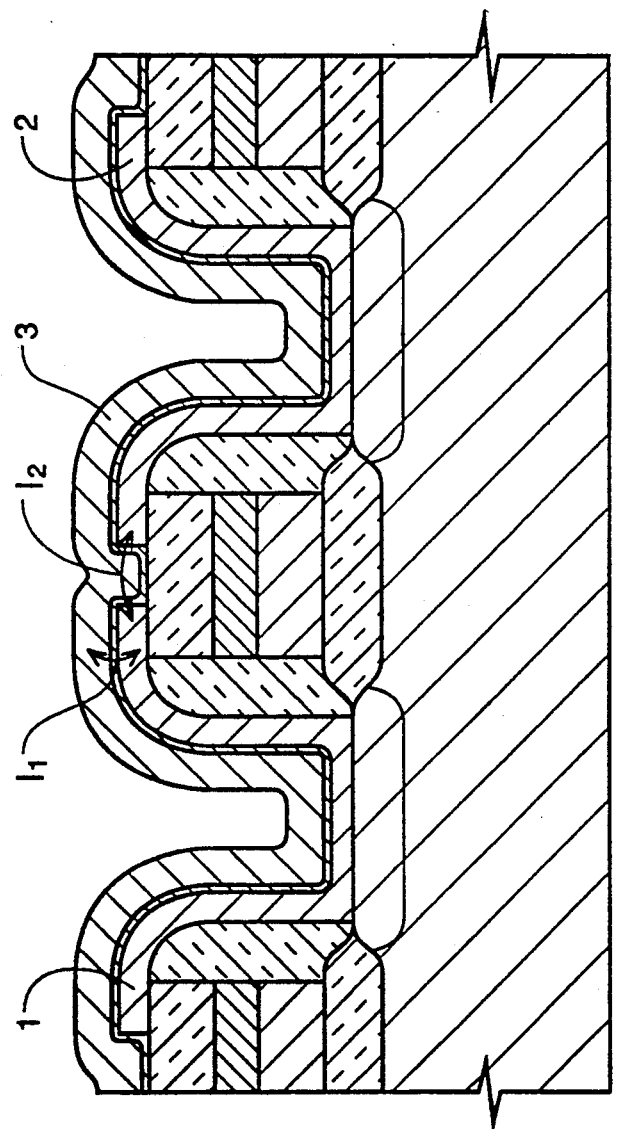
FIG. 1a depicts a conventional stacked capacitor using a thin cell dielectric showing plate to plate leakage current $I_1$ and cell to cell leakage current $I_2$.
Figure 1B:
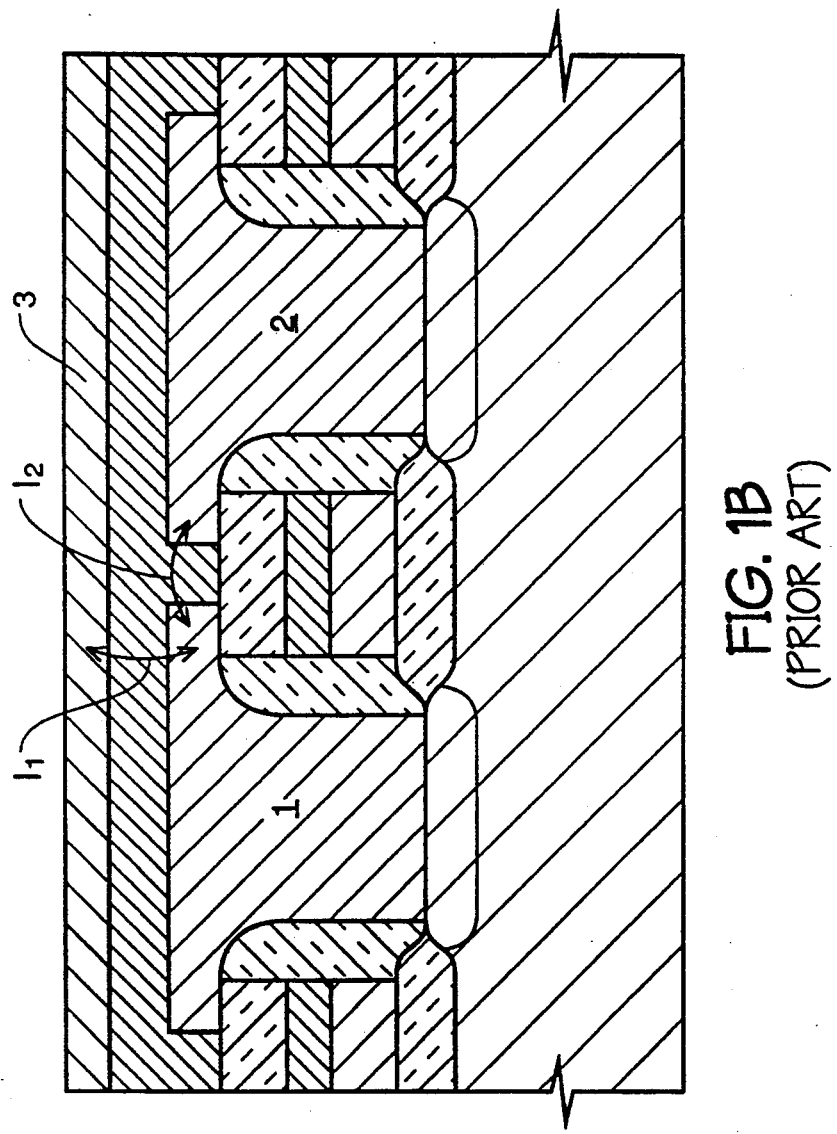
FIG. 1b depicts a stacked capacitor using a thick high dielectric constant cell dielectric showing plate to plate leakage current $I_1$ and cell to cell leakage current $I_2$.
Figure 2:
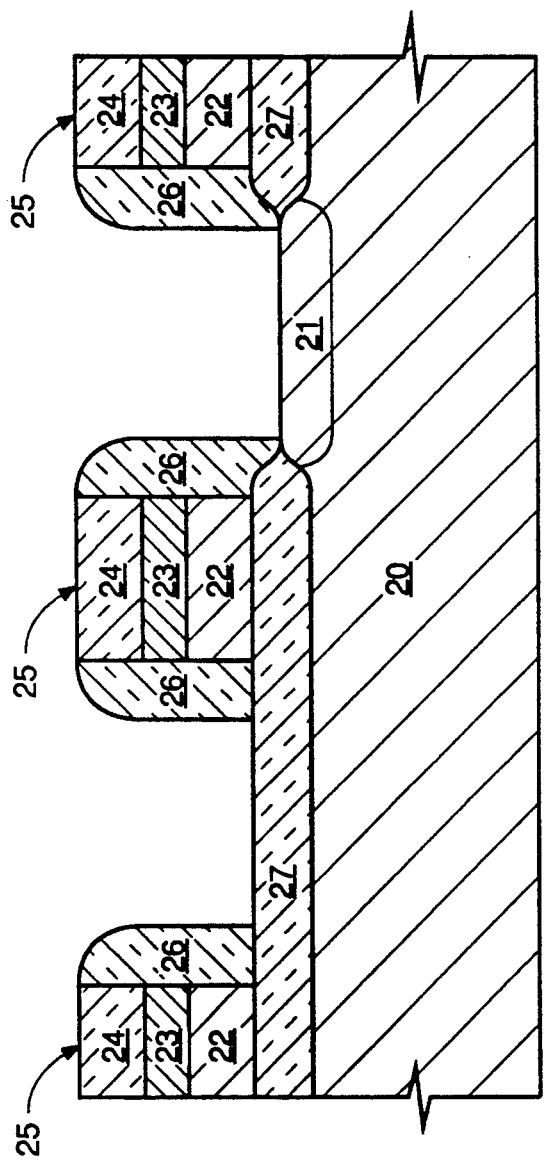
FIG. 2 is a cross-sectional view on an in-process wafer portion taken perpendicular to word lines.

As shown in FIG. 2, poly 22, covered with metal silicide 23 (such as tungsten silicide) and dielectric 24 (either oxide or nitride) are patterned to serve as word lines 25. Word lines 25 are further isolated from one another as well as subsequent conductive layers by dielectric spacers 26 (also either oxide or nitride). Word lines 25 have been previously deposited over a thick layer of field oxide 27. Dielectrics 24 and 26 may be deposited by chemical vapor deposition (CVD). Active areas 21 have been appropriately doped to a desired conductivity type which penetrates into the bulk silicon wafer 20, by conventional process steps. Now the wafer is ready for digit line-formation that will run perpendicular to and over word lines 25.

Figure 3:
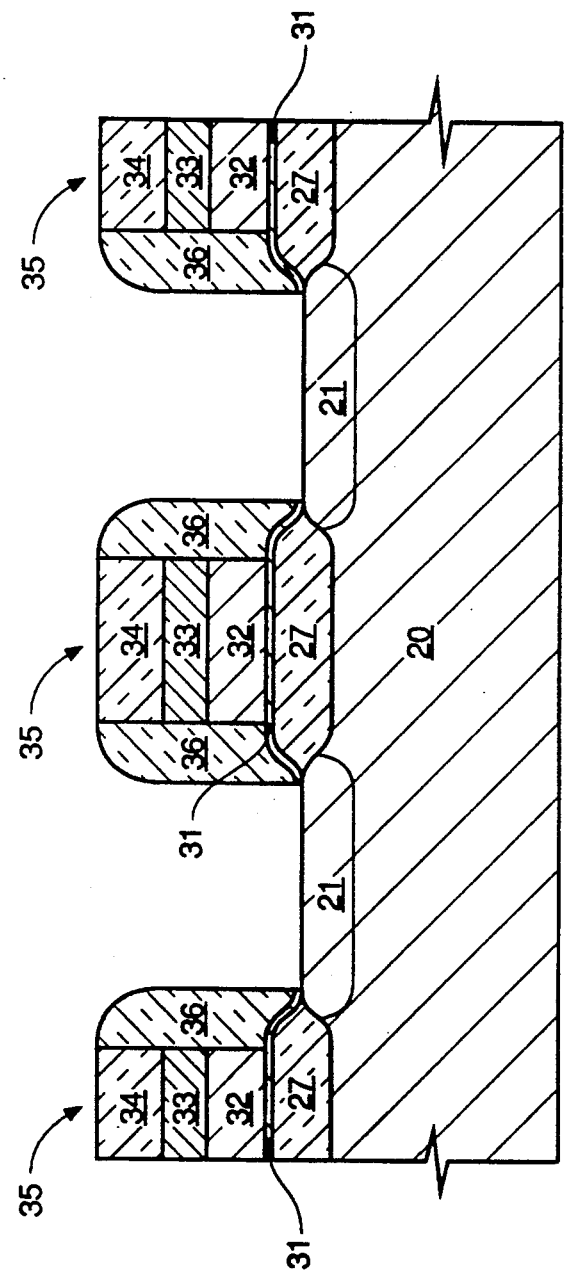
FIG. 3 is a cross-sectional view on an in-process wafer portion taken perpendicular to digit lines.

As shown in FIG. 3, an oxide layer 31 is deposited over the entire wafer array surface followed by self aligned, buried digit line contacts patterning and etch (The buried digit line contacts cannot be seen, as this cross-sectional view does not pass through the buried contacts). Following the etching of the digit line buried contacts, polysilicon 32, covered with metal silicide 33 (such as tungsten silicide) and dielectric 34 are placed, respectively. Dielectric 34 can be either nitride or oxide and is deposited by chemical vapor deposition (CVD) which is preferred for its excellent conformity. The layers of polysilicon 32, silicide 33 and dielectric 34 are patterned and etched to serve as parallel digit lines 35. Polysilicon 32 has previously been conductively doped to electrically couple with silicide 33 to serve as the conductor for digit lines 35. Digit lines 35 run perpendicular to and over the top of word lines 25 (shown in FIG. 2) and conform to the wafer surface resulting in a waveform-like topology running in both the digit line and word line directions. A second dielectric, such as nitride or oxide is now deposited (preferably by CVD), followed by an anisotropic etch to form vertical dielectric spacers 36.

FIGS. 4-11 show the process steps of the preferred embodiment as seen from the cross-sectional view of FIG. 2, showing a cross-section of parallel word lines 25 to present clearer views of the present invention.

Therefore, the preferred embodiment will be described from here on as seen from the word line cross-section.

Figure 4:
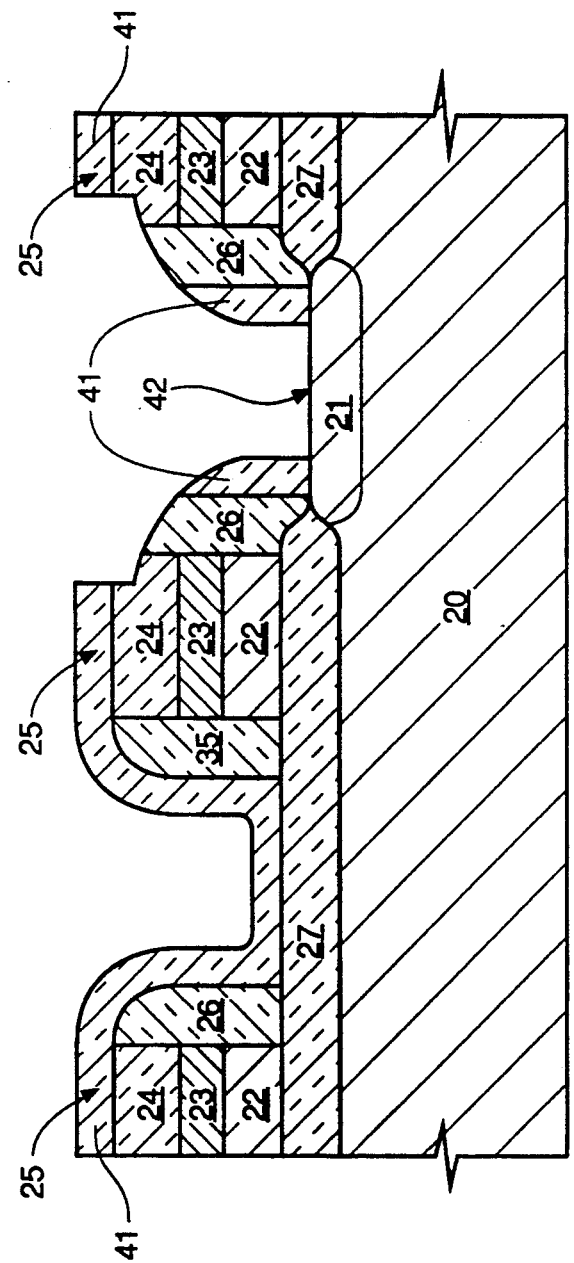
FIG. 4 is a cross-sectional view of the in-process wafer portion of FIG. 2 following a conformal oxide deposition and patterning of a storage node buried contact.

As shown in FIG. 4, word lines 25 and their subsequent isolation layers are then covered with dielectric 41 to a preferred thickness of 500 to 2000 angstroms preferably by CVD. Dielectric 41 may be either a layer of oxide or nitride depending on the process. Following dielectric 41 deposition, a self aligned buried contact to active area 21 is located by coating the wafer surface with a photoresist. Then after applying the appropriate photomask, an anisotropic etch provides an opening for buried contact 42 thus allowing access to active area 21.

Up to this point, process flow has followed that of an array comprising conventional stacked capacitor cells. From this point forward, the process is unique to an array having storage capacitors developed by the present invention.

Figure 5:
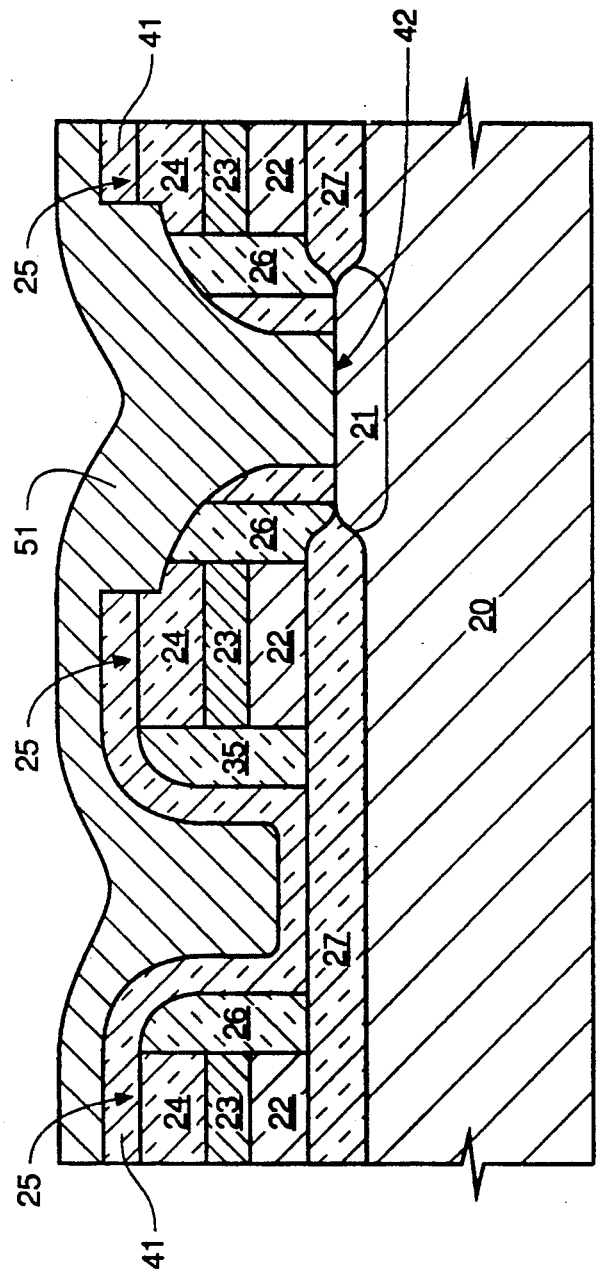
FIG. 5 is a cross-sectional view of the in-process wafer portion of FIG. 4 following a blanket deposition of polysilicon, polysilicon etch-back and doping.

As shown in FIG. 5, once buried contact 42 is established a conformal polysilicon layer 51 is deposited thus making contact to active area 21. Polysilicon layer 51 is etched back to form a semi-planar layer of poly that is conductively doped by conventional methods to serve as a poly storage node cell plate which is to be patterned later in the process. Although it is preferred to deposit a thick layer of polysilicon 51, a conventional thin layer of polysilicon could be deposited to avoid the need to semi-planarize the polysilicon layer. However, a thin layer of polysilicon will create valleys in areas such as at a buried contact or between adjacent word lines. By using a thick cell dielectric (as taught later on in the preferred embodiment) placed over the thin polysilicon, the capacitance will be reduced at these valley areas, thus reducing the overall capacitance of a storage node cell.

Figure 6:
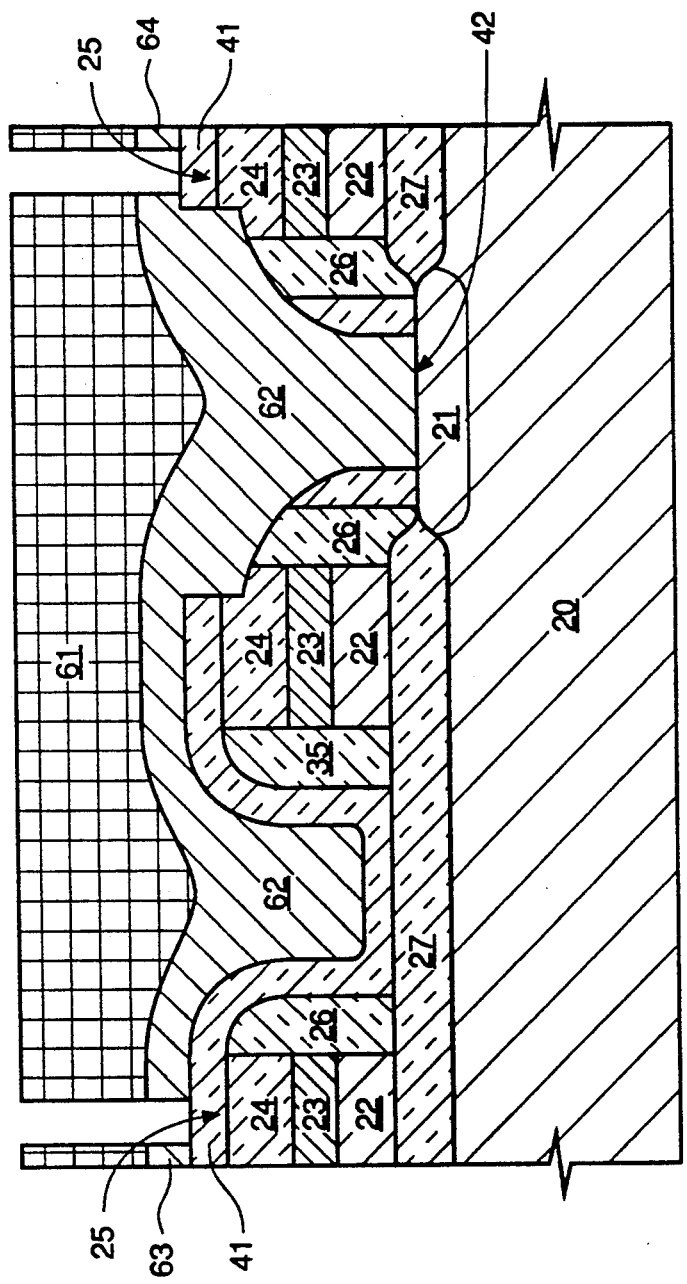
FIG. 6 is a cross-sectional view of the in-process wafer portion of FIG. 5 after patterning and etching of a storage node plate.

As shown in FIG. 6, photoresist 61 is patterned to allow a subsequent poly etch to form a poly storage node plate 62. Edges of two adjacent storage node plates 63 and 64 (also seen in FIG. 6) result from the storage node poly etch.

Figure 7:
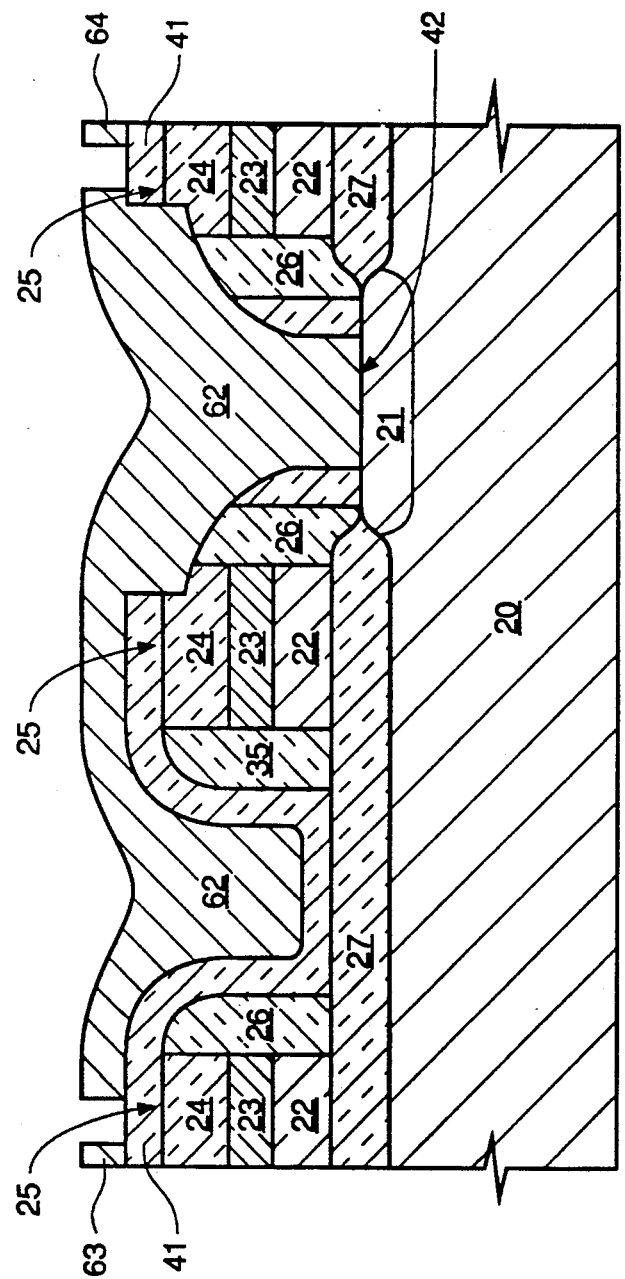
FIG. 7 is a cross-sectional view of the in-process wafer portion of FIG. 6 following a photoresist strip.

As shown in FIG. 7, photoresist 61 (seen in FIG. 6) has been stripped leaving the surfaces of poly storage node plates 62, 63 and 64 exposed.

Figure 8:
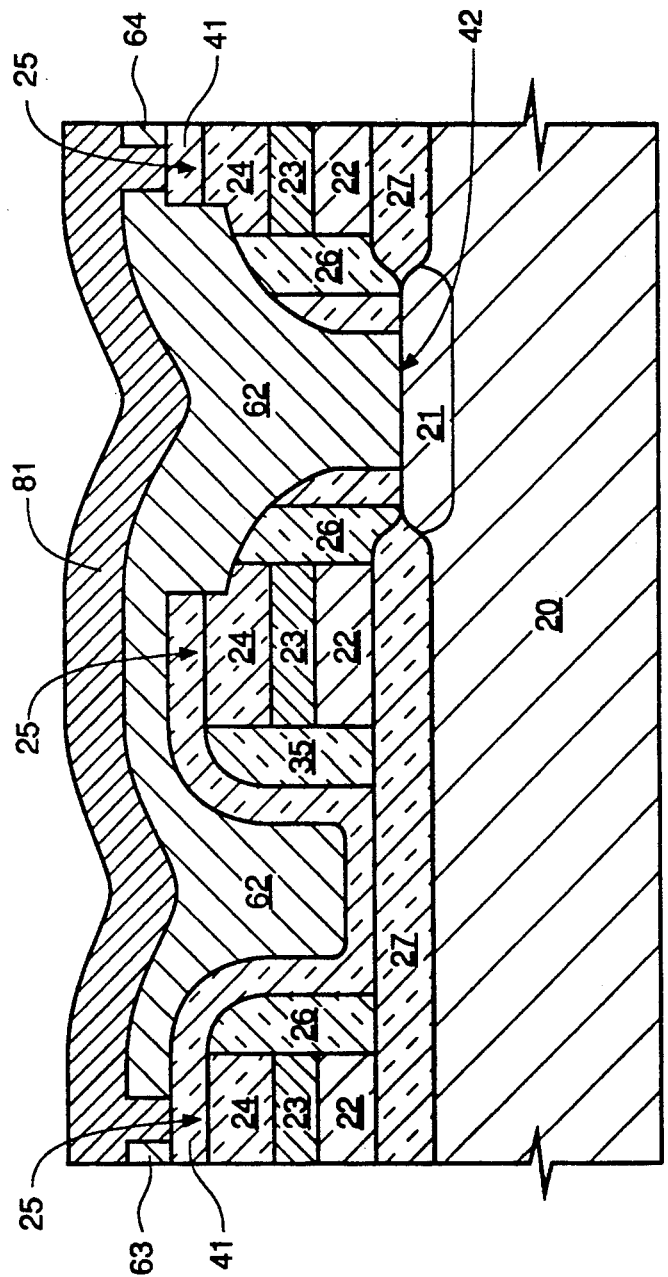
FIG. 8 is a cross-sectional view of the in-process wafer portion of FIG. 7, following a conformal deposition of a low leakage dielectric.
Figure 9:
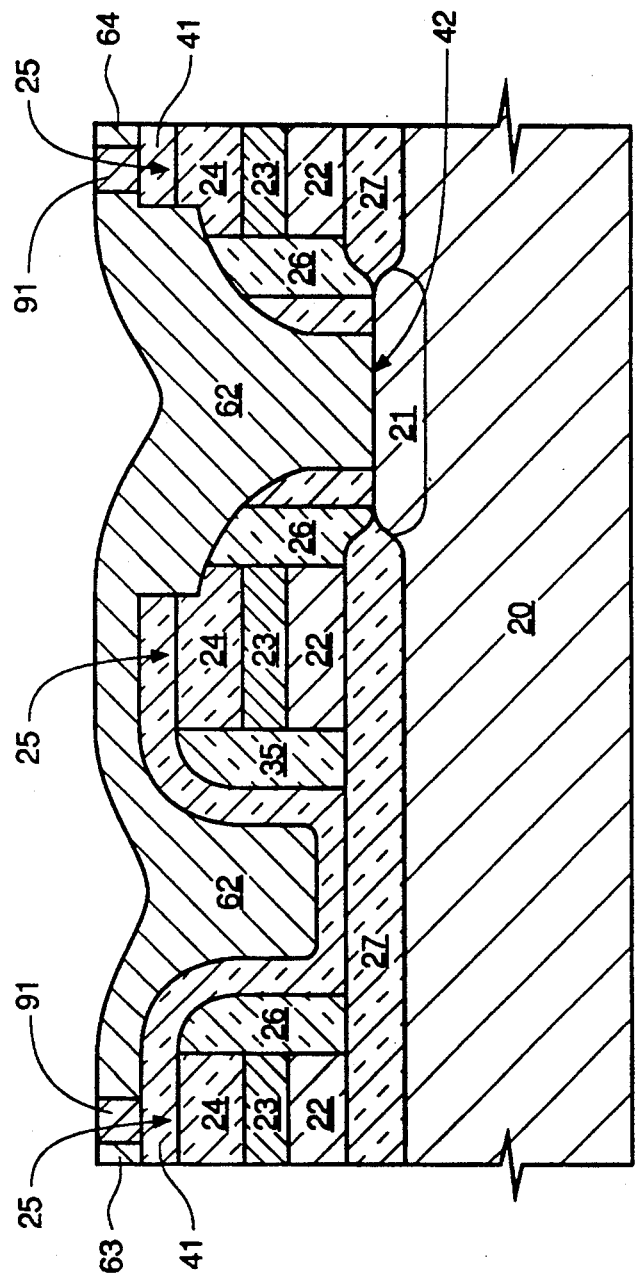
FIG. 9 is a cross-sectional view of the in-process wafer portion of FIG. 8, following an etch-back of the conformal dielectric.

As shown in FIG. 8, a conformal dielectric layer 81 is deposited, followed by a dielectric etch leaving remnant dielectric 91 residing between poly storage node plates 62, 63 and 64, as seen in FIG. 9. Remnant dielectric 91 has added benefit of reducing storage node leakage current between neighboring storage node plates. Only storage node plate 62 is discussed from hereon as its cross-section is resembles all storage capacitors fabricated in a memory array.

Figure 10:
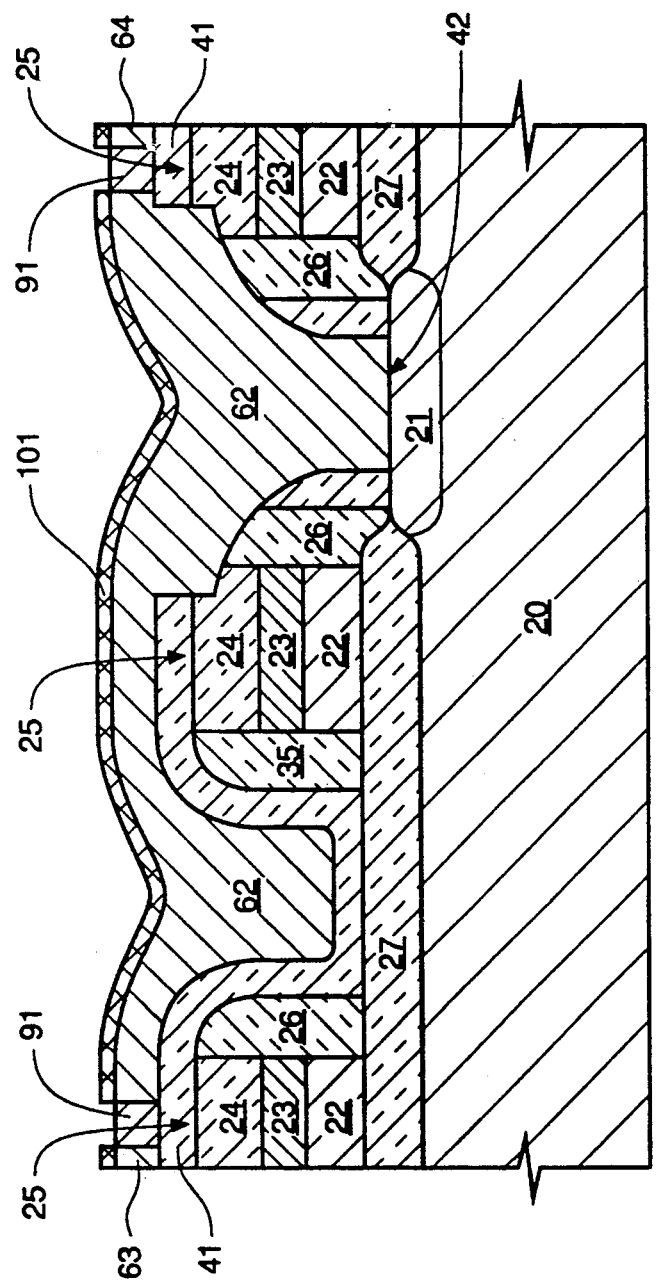
FIG. 10 is a cross-sectional view of the in-process wafer portion of FIG. 9, following formation of a first conformal layer of metal silicide and a selective wet chemical etch.
Figure 11:
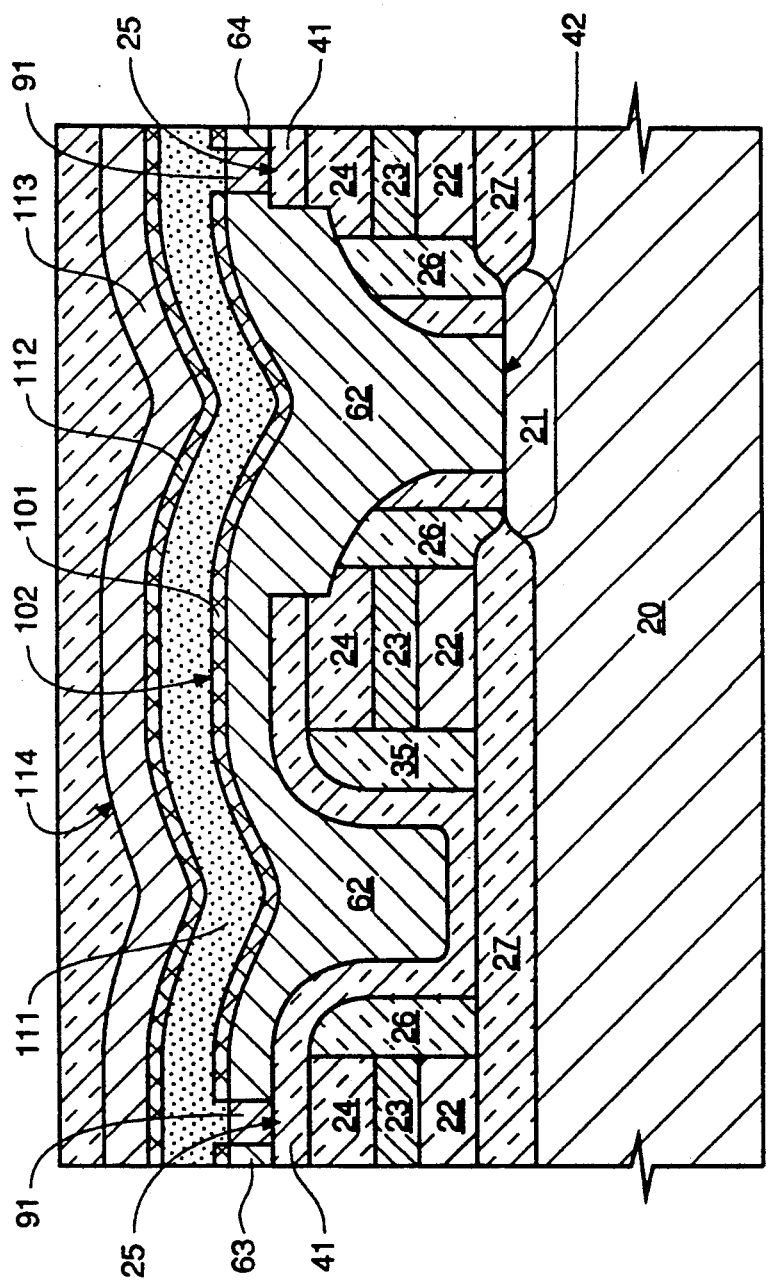
FIG. 11 is a cross-sectional view of the in-process wafer portion of FIG. 10, following depositions of a high dielectric constant material, formation of a second conformal layer of metal silicide, and a layer of conformal polysilicon, respectively.

As seen in FIG. 10, metal silicide 101 is formed by depositing and annealing a metal, such as platinum, cobalt, chromium, or titanium on top of poly storage node plate 62. Metal silicide 101 connects to poly storage node plate 62 to form a completed conductive storage node plate 102 (also a polycide storage electrode). This constitutes the present invention's first use of a polycide storage electrode. A wet chemical metal etch is performed to remove unreacted metal over the isolation regions 91 and thereby isolate adjacent storage node cell plates As shown in FIG. 11, a dielectric material presenting a very high dielectric constant such as $Ta_2O_5$, $Y_2O_3$, $ZrO_2$ a PZT ferroelectric material (lead zirconate titanate or $PbZr_{0.5}Ti_{0.5}O_3$) is then deposited to cover conductive storage node plate 102. If PZT is selected it can be applied preferentially by a sol-gel technique known by one skilled in the art. The high dielectric constant materials mentioned (particularly PZT) are known to present dielectric constant values 100 to 300 times higher than that of generally used cell dielectrics such as $Si_3N_4$. The high dielectric material will serve as cell dielectric 111 thereby isolating storage node plate 102 from a top cell plate to be formed next. Because of the etch-back of the storage node poly 62, the cell dielectric 111 is deposited over a semi-planar storage node cell plate 102. This advantageously creates a uniform thickness of cell dielectric 111 where all regions contribute to cell capacitance thereby maximizing cell capacitance. A second metal layer 112 (such as, platinum, chromium, cobalt, chromium, or titanium) is deposited followed by deposition of another polysilicon layer 113. Metal layer 112 is then annealed and becomes metal silicide 112 that combines with polysilicon 113 and now serves as capacitor cell plate 114 which then becomes a common cell plate (or top polycide electrode) to all storage capacitors in the array. This constitutes the present invention's first use of an inverse polycide process. Conventionally the metal is deposited over the poly, but in the present invention the poly is deposited over the metal.

A second embodiment of the present invention is directed to maximizing storage cell capacitance in a high density/high volume DRAM fabrication process, in a sequence shown in FIGS. 12-15 in conjunction with FIGS. 1-5 that have been described previously. FIGS. 12-15 show the process steps of the second embodiment as seen from the cross-sectional view of FIG. 2, showing a cross-section of parallel word lines 25 to present clearer views of the present invention. Therefore, the preferred embodiment will be described from here on as seen from the word line cross-section.

Figure 12:
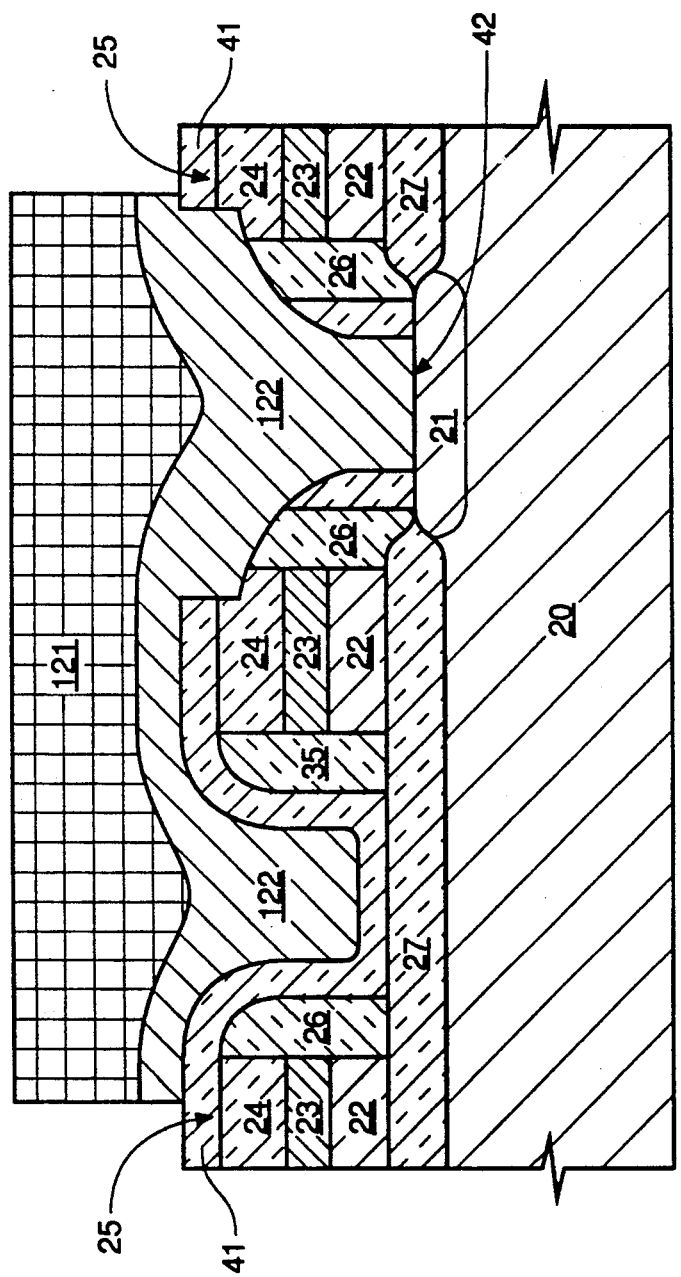
FIG. 12 is a cross-sectional view of the in-process wafer portion of FIG. 5 after patterning and etching a storage node plate.

Referring now to FIG. 12, photoresist 121 is patterned to allow a subsequent poly etch to form a poly storage node plate 122.

Figure 13:
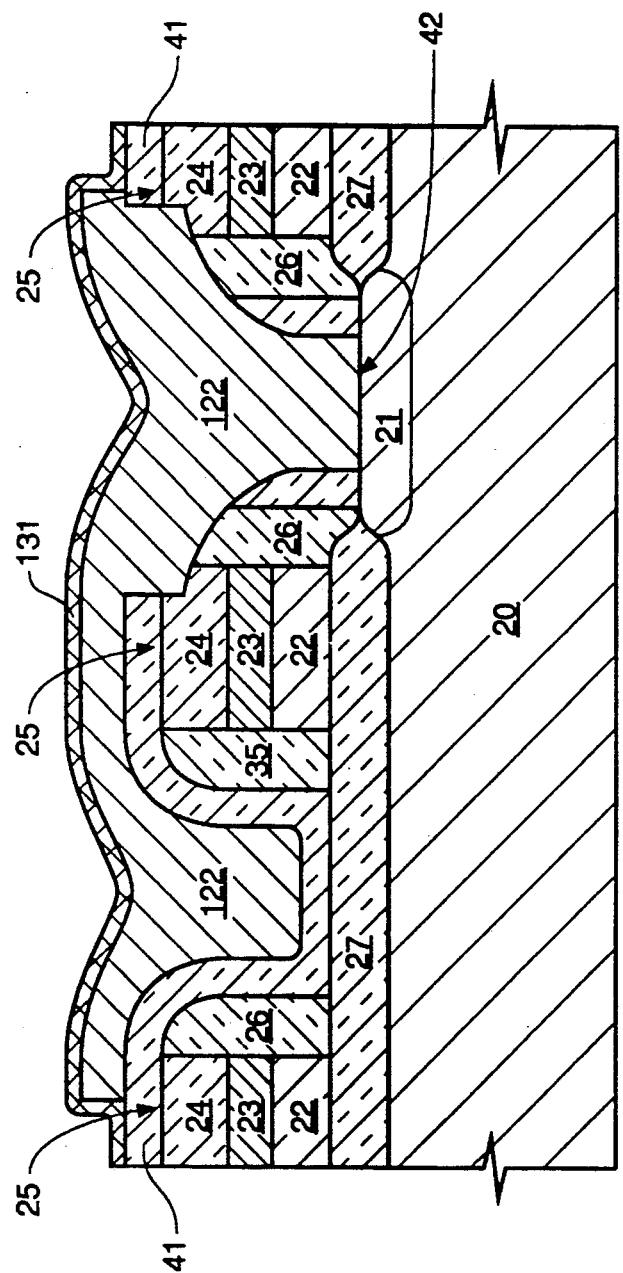
FIG. 13 is a cross-sectional view of the in-process wafer portion of FIG. 12 following a -photoresist strip and formation of a first conformal layer of metal silicide.

As shown in FIG. 13, photoresist 121 (seen in FIG. 12) has been stripped leaving the surfaces of poly storage node plate 122 exposed. Following photoresist 121 strip, metal silicide 131 is formed by depositing and then annealing a metal, such as platinum, chromium, cobalt, chromium, or titanium on top of poly storage node plate 122. A wet chemical metal etch is performed to remove unreacted metal 131 over oxide regions 41, thereby isolating adjacent storage node cell plates.

Figure 14:
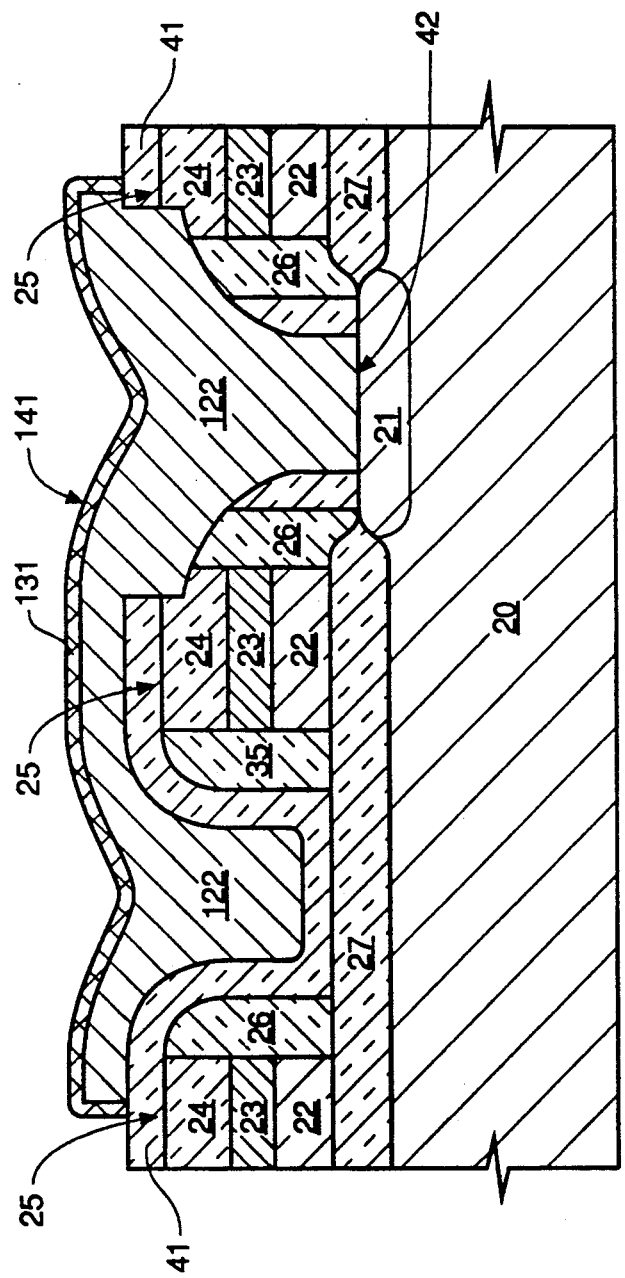
FIG. 14 is a cross-sectional view of the in-process wafer portion of FIG. 13, following a selective etching of the first metal silicide layer.

As shown in FIG. 14, metal silicide 131 is etched and connects to poly storage node plate 122 to form a completed conductive storage node plate 141.

Figure 15:
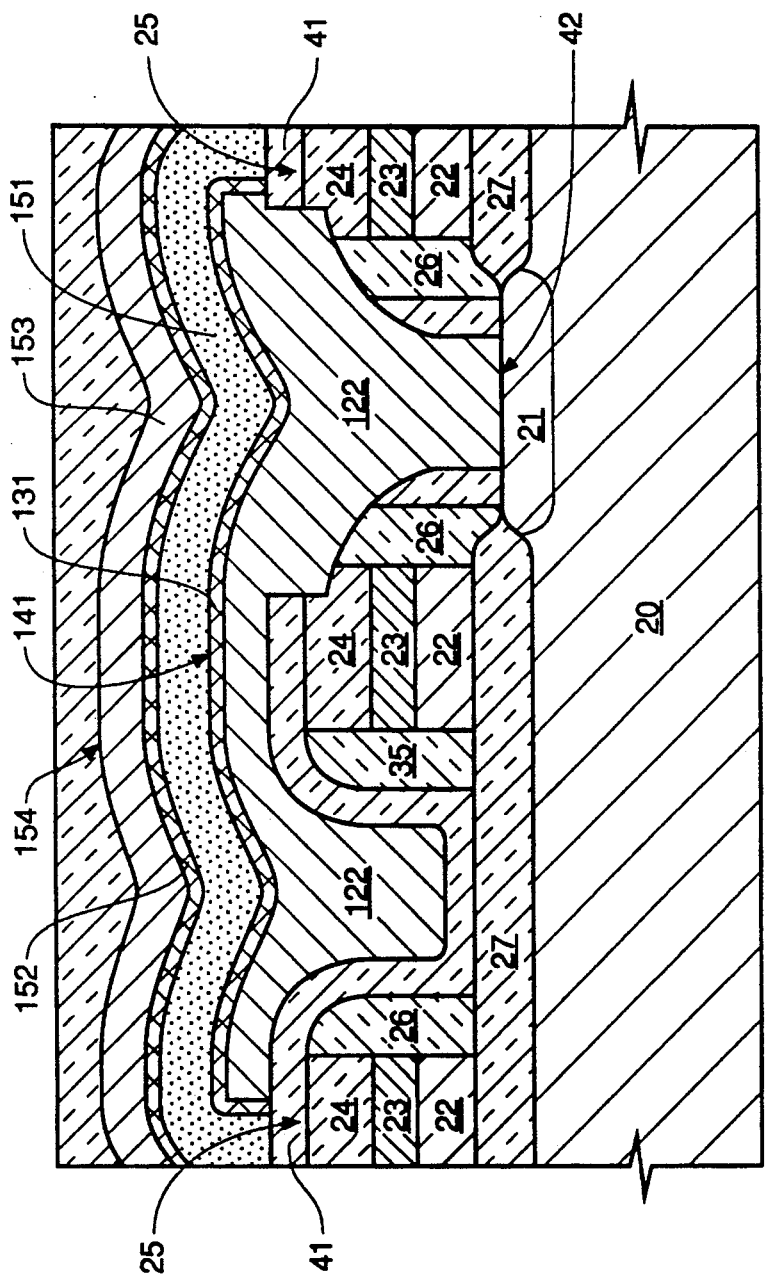
FIG. 15 is a cross-sectional view of the in-process wafer portion of FIG. 14, following depositions of a high dielectric constant material, formation of a second conformal layer of metal silicide, and a layer of conformal polysilicon, respectively.

As shown in FIG. 15, a dielectric material presenting a very high dielectric constant such as $Ta_2O_5$, $Y_2O_3$, $ZrO_2$ or a PZT ferroelectric material (lead zirconate titanate or $PbZr_{0.5}Ti_{0.5}O_3$) is then deposited to cover conductive storage node plate 141. If PZT is selected at can be applied preferentially by a sol-gel technique known by one skilled in the art. The high dielectric constant materials mentioned (particularly PZT) are known to present dielectric constant values 100 to 300 times higher than that of generally used cell dielectrics such as $Si_3N_4$. The high dielectric material will serve as cell dielectric 151 thereby isolating storage node plate 141 from a top cell plate to be formed next. A second metal layer 152 (such as, platinum, chromium, cobalt, chromium, or titanium) is deposited followed by deposition of another polysilicon layer 153. Metal layer 152 is then annealed and becomes metal silicide 152 that combines with polysilicon 153 and now serves as capacitor cell plate 154 which then becomes a common cell plate to all storage capacitors in the array.

Using a very high dielectric constant material for the cell dielectric increases the storage capability of the storage node cell without increasing the area required for cell construction. Also, by forming a metal silicide on the outer surface of the poly capacitor plates, the storage capabilities of the storage capacitor is enhanced. These important features will allow fabrication of similar cell structures for future generations of memory devices such as 64M and 256M DRAMs.

It is to be understood that although the present invention has been described with reference to a preferred embodiment, various modifications, known to those skilled in the art, may be made to the structures and process steps presented herein without departing from the invention as recited in the claims appended hereto.

We claim:

1. A process for fabricating a DRAM array on a silicon substrate, said process comprising the following sequence of steps:
    a) creating a plurality of separately isolated active areas arranged in parallel rows and parallel columns;
    b) creating a gate dielectric layer on top of each active area;
    c) depositing a first conductive layer superjacent surface of said array;
    d) depositing a first dielectric layer superjacent said first conductive layer;
    e) masking and etching said first conductive and said first dielectric layers to form a plurality of parallel conductive word lines aligned along said rows such that each said word line passes over an inner portion of each said active area being separated therefrom by a remanent of said gate dielectric layer;
    f) creating a conductively-doped digit line junction and storage node junction within each said active area on opposite sides of each said word line;
    g) depositing a second dielectric layer superjacent said array surface;
    h) creating a first aligned buried contact location at each said digit line junction in each said active area;
    i) depositing a second conductive layer superjacent said array surface, said second conductive layer making direct contact to said digit line junctions at said first buried contact locations;
    j) depositing a third dielectric layer superjacent to said second conductive layer;
    k) masking and etching said second conductive layer and said third dielectric layer to form a plurality of parallel conductive digit lines aligned along said columns such that a digit line makes electrical contact at each digit line junction within a column, said digital lines running perpendicular to and over said word lines forming a 3-dimensional, waveform-shaped topology;
    l) depositing a fourth dielectric layer superjacent said array surface;
    m) masking and etching a second aligned buried contact location allowing access to an active area and thereby forming vertical sidewalls within opening of said buried contact location;
    n) depositing a third conductive layer superjacent said fourth dielectric layer and said second buried contact opening;
    o) patterning said third conductive layer to form storage node plates having a v-shaped cross-section, said storage node plates conforming to said 3-dimensional, waveform shaped topology and thereby making contact to said active area at said second buried contact location;
    p) depositing a fifth dielectric layer on said storage node plates and etching said fifth dielectric layer to leave to leave a remnant dielectric between the storage node plates of neighboring cells thereby isolating adjacent storage node plates;
    q) placing a cell dielectric layer superjacent an exposed upper portion of said storage node plate, said cell dielectric layer conforming to existing waveform shaped topology, said cell dielectric layer is a layer of high dielectric constant material; and
    r) depositing a fourth conductive layer superjacent said cell dielectric layer, thereby forming a top cell plate common to the entire memory array.

2. A process as recited in claim 1, wherein said gate dielectric layer is silicon oxide.

3. A process as recited in claim 1, wherein said first and said second buried contacts are self aligned.

4. A process as recited in claim 1, wherein said first, said second, said third and said fourth conductive layers comprise a layer of metal silicide and a layer of conductively-doped polysilicon.

5. A process as recited in claim 4, wherein said metal silicide layer is formed from a metal selected from the group consisting essentially of platinum, chromium, cobalt, chromium, or titanium.

6. A process as recited in claim 1, wherein said first, said second, said third and said fourth dielectric layers are selected from the group consisting essentially of silicon oxide or nitride.

7. A process as recited in claim 1, wherein said first, said second, said third and said fourth dielectric layers are deposited by chemical vapor deposition.

8. A process as recited in claim 1, wherein said high dielectric constant material is selected from the group consisting essentially of $Ta_2O_5$, $Y_2O_3$, $ZrO_2$, lead zirconate titanate or $PbZr_{0.5}Ti_{0.5}O_3$.

9. A process as recited in claim 1, wherein said fifth dielectric layer is selected from the group consisting essentially of oxide or nitride.

10. A process as recited in claim 1, wherein said high dielectric constant material is a PZT ferroelectric material applied by a sol-gel method.

11. A process for fabricating a DRAM storage capacitor on a silicon substrate having active areas, word lines and digit lines, said process comprising the following sequence of steps:
    a) depositing a fist dielectric layer on surface of said silicon, said first dielectric layer conforming to existing topology;
    b) masking and etching a self aligned buried contact location allowing access to said active area and thereby forming vertical sidewalls within opening of said buried contact location;
    c) depositing a first conductive layer superjacent said first dielectric layer and said buried contact opening;
    d) patterning said first conductive layer to form storage node plates having a v-shaped cross-section, said storage node plates conforming to said existing topology and thereby making contact to said active area at said buried contact location;

e) depositing a second dielectric layer on said storage node plates and etching said second dielectric layer to leave a remmant dielectric between the storage node plates of neighboring cells thereby isolating adjacent storage node plates;

f) placing a cell dielectric layer superjacent an exposed upper portion of said storage node plates said cell dielectric layer is a layer of high dielectric constant material; and g) depositing a second conductive layer superjacent said cell dielectric layer, thereby forming a top cell plate common to the entire memory array.

12. A process as claimed in claim 11, wherein said buried contact is self aligned.

13. A process as recited in claim 11, wherein said first and said second conductive layers comprise a layer of metal silicide and a layer of conductively-doped polysilicon.

14. A process as recited in claim 13, wherein said metal silicide layer is formed from a metal selected from the group consisting essentially of platinum, chromium, cobalt, chromium, or titanium.

15. A process as recited in claim 11, wherein said high dielectric constant material is selected from the group consisting essentially of $Ta_2O_5$, $Y_2O_3$, $ZrO_2$, lead zirconate titanate or $PbZr_{0.5}Ti_{0.5}O_3$.

16. A process as recited in claim 11, wherein said second dielectric layer is selected from the group consisting essentially of silicon oxide or nitride.

17. A process as recited in claim 11, wherein said first dielectric layer is selected from the group consisting essentially of oxide or nitride.

18. A process as recited in claim 11, wherein said first dielectric layer is deposited by chemical vapor deposition.

19. A process as recited in claim 11, wherein said high dielectric constant material is a PZT ferroelectric material applied by a sol-gel method.

* * * * *